(12) United States Patent
Benisty et al.

(10) Patent No.: US 11,569,844 B2
(45) Date of Patent: Jan. 31, 2023

(54) OPTIMIZATIONS FOR VARIABLE SECTOR SIZE IN STORAGE DEVICE NAMESPACES

(71) Applicant: Western Digital Technologies, Inc., San Jose, CA (US)

(72) Inventors: Shay Benisty, Beer Sheva (IL); Ran Zamir, Ramat Gan (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 289 days.

(21) Appl. No.: 16/910,893

(22) Filed: Jun. 24, 2020

(65) Prior Publication Data

US 2021/0409038 A1 Dec. 30, 2021

(51) Int. Cl.
*H03M 13/00* (2006.01)
*H03M 13/11* (2006.01)
*G06F 12/02* (2006.01)
*H03M 13/15* (2006.01)

(52) U.S. Cl.
CPC ..... *H03M 13/1174* (2013.01); *G06F 12/0246* (2013.01); *H03M 13/1177* (2013.01); *H03M 13/1575* (2013.01); *G06F 2212/403* (2013.01); *G06F 2212/7207* (2013.01)

(58) Field of Classification Search
CPC ......... H03M 13/1174; H03M 13/1177; H03M 13/1575; G06F 12/0246; G06F 2212/403; G06F 2212/7207
See application file for complete search history.

(56) References Cited

U.S. PATENT DOCUMENTS

| | | | | |
|---|---|---|---|---|
| 10,944,429 | B1 * | 3/2021 | Yang | H03M 13/616 |
| 11,050,438 | B2 * | 6/2021 | Kim | H03M 13/616 |
| 2019/0349004 | A1 * | 11/2019 | Zhang | H04L 1/0041 |
| 2020/0321982 | A1 * | 10/2020 | Kamiya | H03M 13/6516 |

* cited by examiner

*Primary Examiner* — Christine T. Tu
(74) *Attorney, Agent, or Firm* — Patterson & Sheridan, LLP; Steven H. VerSteeg

(57) ABSTRACT

A method and apparatus for determining the sector size and concomitant host metadata size to determine the difference between total size of the data block to be stored, and using the difference for parity data. This allows an increase in parity bits available for smaller sector sizes and/or data with smaller host metadata sizes. Because the amount of space available for additional parity bits is known, data with lower numbers of parity bits may be assigned to higher quality portions a memory array written with longer programming trim times, and/or written to memory dies with good redundant columns, further increasing performance and reliability.

20 Claims, 6 Drawing Sheets

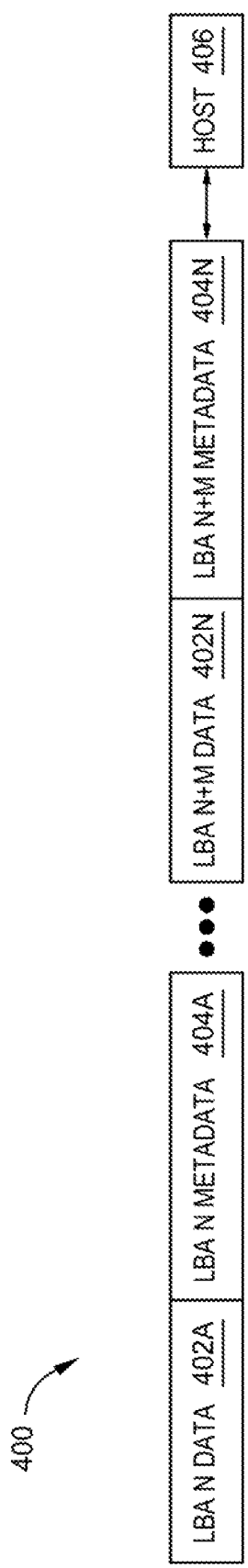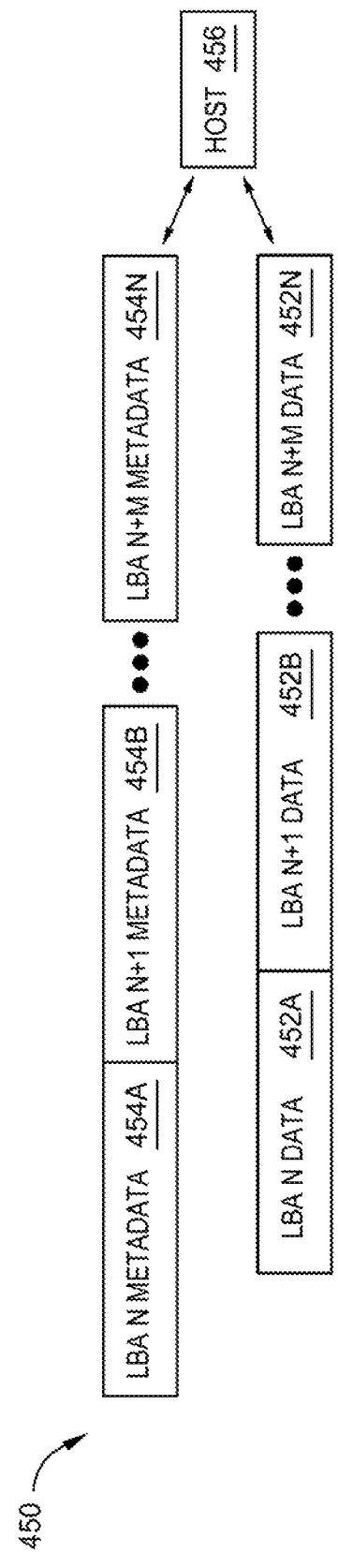

OPTIMIZATIONS FOR VARIABLE SECTOR SIZE IN STORAGE DEVICE NAMESPACES

BACKGROUND

Embodiments of the present disclosure generally relate to error correction codes for encoding and decoding data, and more particularly to selecting error correction codes based on data size attributes.

A namespace may be distributed across one or more dies (e.g., NAND dies) of a memory device, as well as across multiple memory devices. Data written/read by a host is typically addressed to a logical block address (LBA) in a namespace, and accompanied by metadata related to the LBA. Although the total size of the LBA and related metadata may be fixed from the perspective of the host, the field sizes within the metadata may vary.

Typically, the internal variance of host metadata size is normalized by padding the data to achieve an expected total data size. This padding results in unused space that could be repurposed to increase the performance of a data storage device.

What is needed are systems and methods to utilize bytes that the prior approaches would allocate to padding in useful ways to increase the performance of a data storage device.

SUMMARY

The present disclosure generally relates to methods and systems for determining the sector size and concomitant host metadata size to determine the difference between the total size of a data block to be stored, and using the difference for parity data, instead of padding as in prior approaches. This causes an increase in parity bits available for smaller sector sizes and/or data with smaller host metadata sizes. Because the amount of space available for additional parity bits is known, data with lower numbers of parity bits may be assigned to higher quality portions of one or more memory dies, written with longer programming trim times, and/or written to dies with good redundant columns, further increasing performance and reliability.

In one embodiment, a data storage device is disclosed, including one or more memory devices, and a controller comprising a processor configured to perform a method for improving the performance of the storage device. In embodiments, the method includes receiving a logical block address (LBA) size of an LBA, from a host, receiving a host metadata size from the host, and determining a parity size of an error correction code (ECC), based on the LBA size and the host metadata size.

In another embodiment, a controller for a data storage device is disclosed, including an I/O to one or more memory devices, and a processor configured to execute a method for improving the performance of the data storage device composed of the controller. In embodiments, the method comprises receiving a request from a host for data at an LBA, and selecting a low density parity check (LDPC) matrix from a plurality of ECC matrices, for decoding the data.

In another embodiment, a data storage system is disclosed, including one or more memory means, and one or more controller means configured to execute a method for improving the performance of the data storage system. In embodiments, the method includes receiving data to the one or more memory means from a host, and selecting an LDPC matrix to encode the data, based on a sector size of the received data, reading data from the one or more memory means, and decoding the data using an LDPC matrix selected from one or more LDPC matrices, based on the sector size of the data.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4A depicts a schematic illustration of metadata interweaved with LBA data, according to disclosed embodiments.

FIG. 4B depicts a schematic illustration of metadata separated from LBA data, according to disclosed embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, a reference to "the disclosure" shall not be construed as a generalization of any inventive subject matter disclosed herein and shall not be considered to be an element or limitation of the appended claims except where explicitly recited in a claim(s).

The present disclosure determines the sector size and concomitant host metadata size to determine the difference between the total size of a data block to be stored and using the difference for parity data, instead of padding as in prior approaches. This causes an increase in parity bits available for smaller sector sizes and/or data with smaller host metadata sizes. Because the amount of space available for additional parity bits is known, data with lower numbers of parity bits may be assigned to higher quality portions of one or more memory dies, written with longer programming trim times, and/or written to memory dies with good redundant columns, further increasing performance and reliability.

Figure 1:
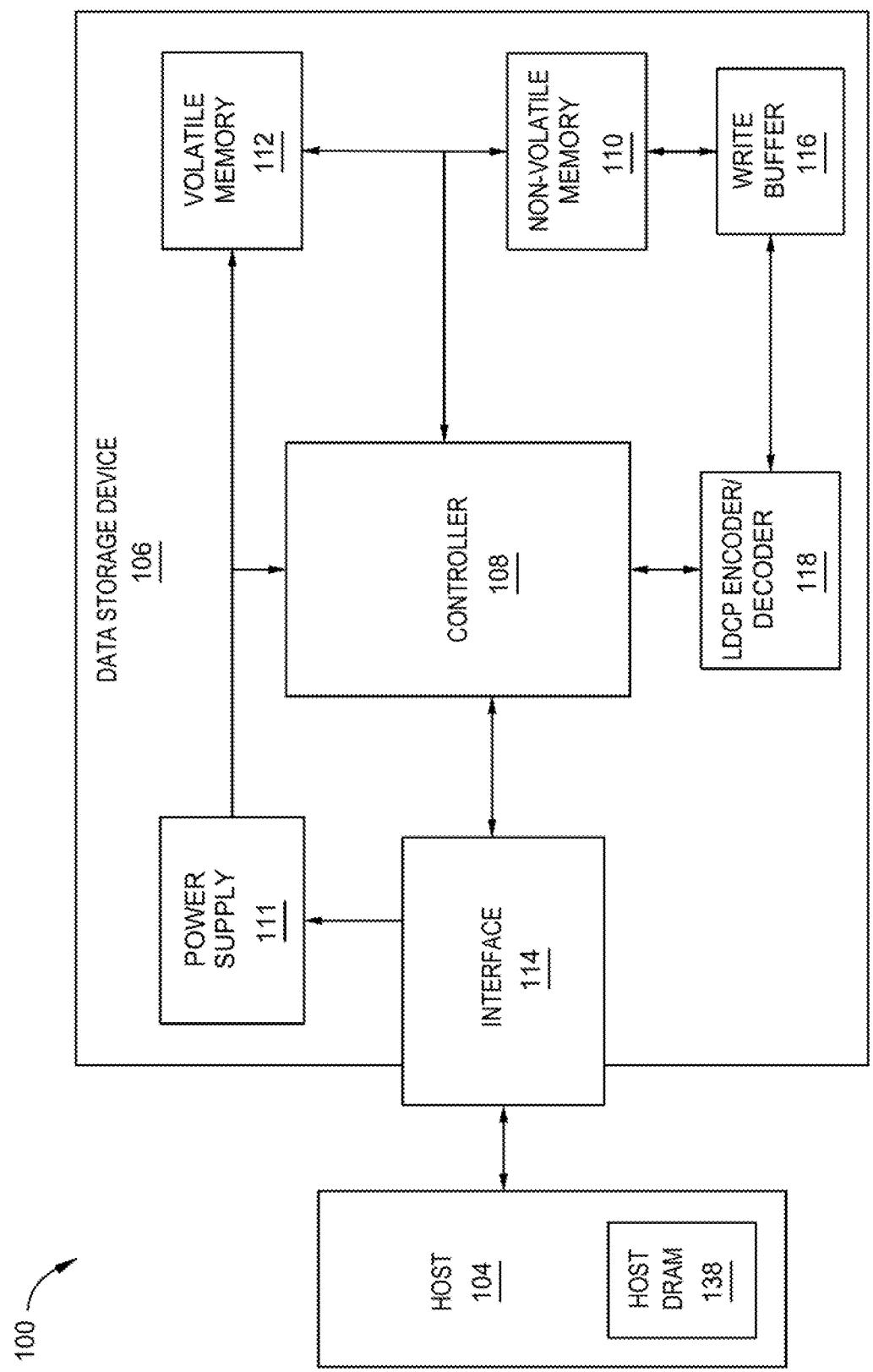
FIG. 1 depicts a schematic block diagram illustrating a storage system having a storage device that may function as a storage device for a host device, in accordance with one or more techniques of this disclosure.

FIG. 1 is a schematic block diagram illustrating a storage system 100 in which data storage device 106 may function as a storage device for a host device 104, in accordance with one or more techniques of this disclosure. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The storage system 100 includes a host device 104, which may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The data storage device 106 includes NVM 110, which may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single physical chip may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices. Further, although the disclosure refers to NAND dies, it will be apparent to those of skill in the art that the disclosure may apply to other types of memory dies or memory arrays or memory circuits.

The NVM 110 may comprise a plurality of flash memory devices or memory units. Flash memory devices may include NAND or NOR based flash memory devices and may store data based on a charge contained in a floating gate of a transistor for each flash memory cell. In NAND flash memory devices, the flash memory device may be divided into a plurality of blocks, which may be divided into a plurality of pages. Each block of the plurality of blocks within a particular memory device may include a plurality of NAND cells. Rows of NAND cells may be electrically connected using a word line to define a page of a plurality of pages. Respective cells in each of the plurality of pages may be electrically connected to respective bit lines. Furthermore, NAND flash memory devices may be 2D or 3D devices and may be single level cell (SLC), multi-level cell (MLC), triple level cell (TLC), or quad level cell (QLC). The controller 108 may write data to and read data from NAND flash memory devices at the page level and erase data from NAND flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, the controller 108 may use volatile memory 112 as a cache. For instance, the controller 108 may store cached information in volatile memory 112 until cached information is written to non-volatile memory 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory or write buffer 116 before sending the data to the NVM 110.

The data storage device 106 includes a low density parity code (LDPC) encoder/decoder 118. The LDPC encoder/decoder 118 may include an internal memory to hold several matrices that include a plurality of error correction codes (ECC). The one or more matrices of the internal memory of the LDPC encoder/decoder 118 may allow for fast switching between matrices to avoid any firmware (FW) intervention or performance loss due to the time to switch between matrices.

Figure 2:
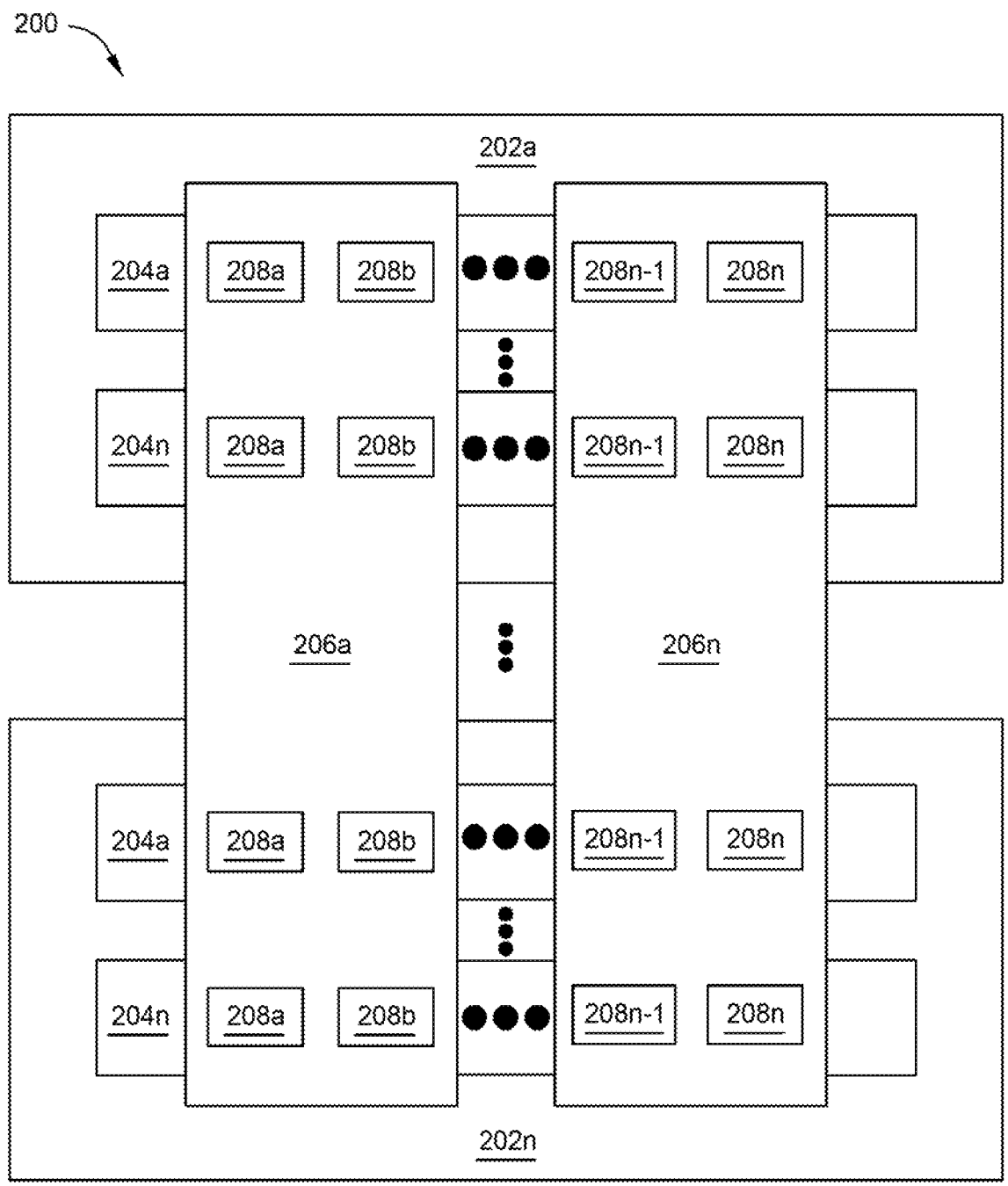
FIG. 2 depicts a schematic illustration of a multi-namespace NAND structure, according to disclosed embodiments.

FIG. 2 is a schematic illustration of a multi-namespace NAND structure 200, according to disclosed embodiments. The multi-namespace NAND structure 200 includes a plurality of NAND channels 202a-202n, where each NAND channel 202a-202n includes one or more dies 204a-204n. Each NAND channel 202a-202n may have a dedicated hardware (HW) interface, such that each NAND channel 202a-202n is independent of another NAND channel 202a-202n. Each of the one or more dies 204a-204n includes one or more blocks 208a-208n. The multi-namespace NAND structure 200 further includes one or more namespaces 206a-206n, where each namespace 206a-206n includes one or more blocks 208a-208n from each of the plurality of dies.

In one embodiment, the size of each of the plurality of namespaces are equal. In another embodiment, the size of each of the plurality of namespaces are not equal. In yet another embodiment, the size of one or more namespaces are equal, and the size of the remaining one or more namespaces are not equal.

For example, a first namespace 206a includes the first block 208a and the second block 208b from each die 204a-204n of each NAND channel 202a-202n. A namespace 206a-206n may include two blocks 208a-208n from each die 204a-204n, such that two blocks 208a-208n increases parallelism when reading or writing data to the die 204a-204n and/or zone 206a-206n. In one embodiment, a namespace may include an even number of blocks from each die. In another embodiment, a namespace may include an odd number of blocks from each die. In yet another embodiment, a namespace may include one or more blocks from one or more dies, where the one or more blocks may not be chosen from one or more dies.

Furthermore, the data transfer size associated with each write command to a namespace 206a-206n may be in the size of a block to take advantage of NAND parallelism. If the data transfer size (e.g., write size) associated with a write command is less than the minimum transfer size (e.g., write size), such as the size of an block, the write command may be held at a buffer, such as a write buffer 116 of FIG. 1, until the one or more write commands held at the buffer aggregate to the minimum transfer size. When executing the one or more write commands in parallel, the data transfer is interleaved with each write command in order to minimize the size of the write cache buffer (e.g., the write buffer 116).

Figure 3:
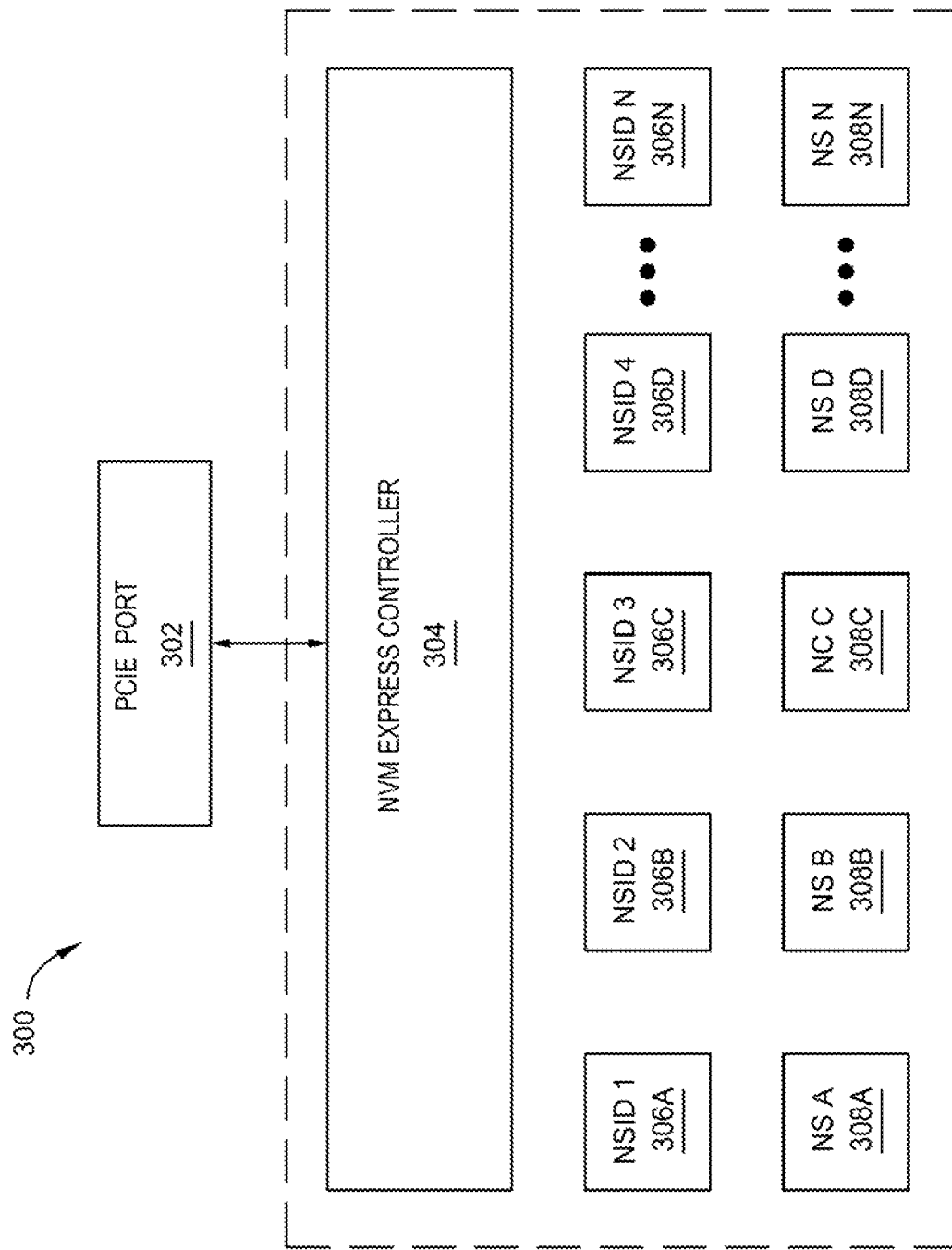
FIG. 3 depicts a schematic illustration of an NVM express controller with multi-namespaces, according to disclosed embodiments.

FIG. 3 is a schematic illustration of an NVM express controller 304 with multi-namespaces, according to disclosed embodiments. The NVM express controller 304 may schedule the ingress and egress of data from the PCIe port 302. In one embodiment, the NVM express controller 304 is a single function PCI express device and is associated with a PCI function 0. The PCIe port 302 may be coupled to the controller, such as the controller 108 of FIG. 1, of the data storage device, such as the data storage device 106, where the PCIe port 302 may be responsible for transferring the data from the host device, such as the host device 104 of FIG. 1, to the data storage device.

The NVM express controller 304 supports one or more namespaces NS A-NS N 308A-308N. Each of the one or more namespaces NS A-NS N 308A-308N are associated with a unique namespace ID (NSID). For example, a first namespace NS A 308A is associated with a first namespace ID NSID A 306A, a second namespace NS B 308B is associated with a second namespace ID 306B, and so forth. In one embodiment, the number of namespace IDs matches the number of namespaces in the NVM. For example, for an Nth namespace NS N 308N, the corresponding namespace ID is NSID N 306N. The controller may utilize the one or more namespace IDs NSID A-NSID N 306A-306N to reference a specific namespace. For example, the namespace ID is distinct from the corresponding namespace. The namespace ID may be the handle that a host and a controller may use to specify a particular namespace in a command.

FIG. 4A is a schematic illustration of metadata interweaved with LBA data, according to disclosed embodiments. FIG. 7B is a schematic illustration of metadata separated from LBA data, according to disclosed embodiments. The one or more metadata 404A-404N, 454A-454N transferred to and from the host 406, 456 includes additional generated data that may be used for quality control, management of information, and end-to-end protection signatures of the corresponding one or more LBA data 402A-402N, 452A-452N. In one embodiment, the one or more metadata 404A-404N, 454A-454N are generated by the host 406, 456. In another embodiment, the one or more metadata 404A-404N, 454A-454N are generated by the controller while encoding the data to the relevant memory location. In yet another embodiment, the one or more metadata 404A-404N, 454A-454N are generated by both the host 406, 456, and the controller.

In FIG. 4A, the one or more metadata 404A-404N are interleaved with the one or more LBA data 402A-402N. Each of the one or more metadata 404A-404N follows the associated one or more LBA data 402A-402N. For example, a first LBA N metadata 404A is associated with a first LBA N data 402A. When programming the data string to either the NVM or the host 406, the first LBA N data 402A is programmed first, and the first LBA N metadata 404A is programmed sequentially after, thus forming a contiguous, extended logical block. In one embodiment, the contiguous, extended logical block utilizes a single buffer.

In FIG. 4B, one or more metadata 454A-454N are separate from the one or more LBA data 452A-452N. For example, a first logical block includes the one or more LBA data 452A-452N, and a second logical block includes one or more metadata 454A-454N. The second logical block that includes one or more metadata 454A-454N may be programmed separately to or from the host 456. For example, the first logical block that includes the one or more LBA data 452A-452N may be programmed to the NVM prior to programming the second logical block that includes the one or more metadata 454A-454N. In one embodiment, the first logical block that includes the one or more LBA data 452A-452N and the second logical block that includes the one or more metadata 454A-454N each utilizes separate buffer.

Figure 5:
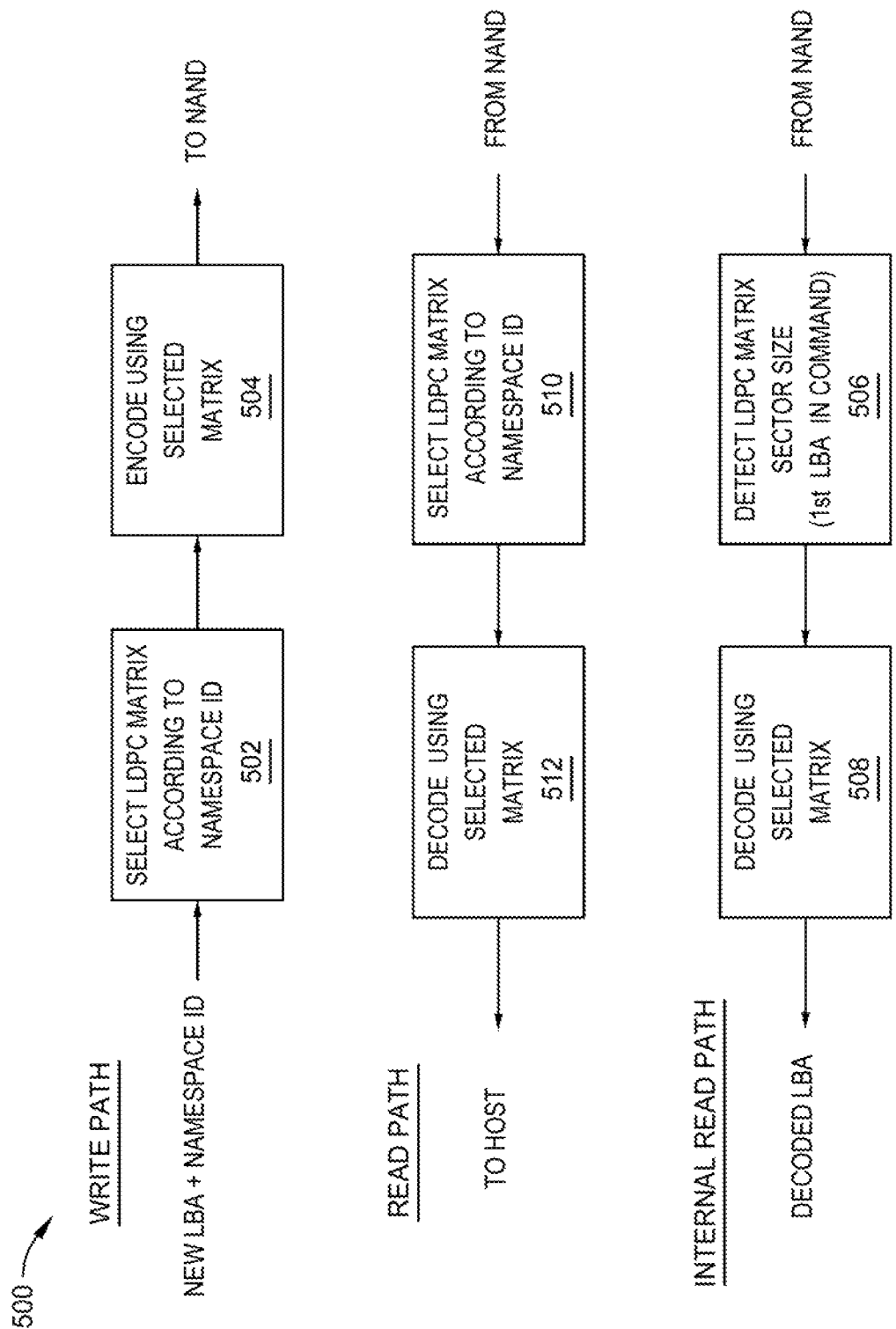
FIG. 5 depicts a flow diagram of selecting ECC size according to the namespace sector size, according to disclosed embodiments.

FIG. 5 is a flow diagram of selecting error correction code (ECC) size according to the namespace sector size, according to disclosed embodiments. Each namespace sector size may be stored in the LDPC encoder/decoder, such as the LDPC encoder/decoder 118 of FIG. 1. The LDPC encoder/decoder includes a plurality of matrices, where each matrix includes a plurality of configuration sets. Each of the plurality of configuration sets represents a different codeword, where each codeword includes user data, header data, and the parity bit size. In one embodiment, the size of both the user data and the header data may be considered as the payload size. Similarly, the payload size plus the parity bit size may be considered as the output size. Each of the plurality of configuration sets includes one or more configurations on generating the parity bits of the matrix. For example, if the parity bit size is fixed, then the LDPC matrix includes a single configuration set. However, if a plurality parity bit sizes are present, then the LDPC matrix includes multiple configuration sets, where each configuration set may account for one or more parity bits of the plurality of parity bits. Furthermore, a first matrix of the plurality of matrices of the LDPC encoder/decoder may track a first number of namespaces and a second matrix of the plurality of matrices may track a second number of namespaces. Each namespace includes one or more sectors, where each sector may include different compositions of data sizes. Table 1 below depicts the breakdown of various sector sizes according to prior approaches that include padding to achieve the total sector size, while Table 2 depicts example breakdowns of various sector sizes according to disclosed embodiments with no padding, or minimal padding. The listed values of Table 2 are not intended to be limiting, but to provide an examples of possible embodiments.

TABLE 1

| LBA Size | Host Metadata Size | Internal Header Size | Logical Block Total Size | Parity Size | Padding Size | Sector Total Size |
|---|---|---|---|---|---|---|
| 512 | 0 | 32 | 4,128 | 328 | 128 | 4,584 |
| 512 | 8 | 32 | 4,192 | 328 | 64 | 4,584 |
| 512 | 16 | 32 | 4,256 | 328 | 0 | 4,584 |
| 4,096 | 0 | 32 | 4,128 | 328 | 128 | 4,584 |
| 4,096 | 8 | 32 | 4,136 | 328 | 120 | 4,584 |
| 4,096 | 16 | 32 | 4,144 | 328 | 112 | 4,584 |
| 4,096 | 64 | 32 | 4,192 | 328 | 64 | 4,584 |
| 4,096 | 72 | 32 | 4,200 | 328 | 56 | 4,584 |

TABLE 2

| LBA Size | Host Metadata Size | Internal Header Size | Logical Block Total Size | Parity Size | Padding Size | Sector Total Size |
|---|---|---|---|---|---|---|
| 512 | 0 | 32 | 4,128 | 456 | 0 | 4,584 |
| 512 | 8 | 32 | 4,192 | 392 | 0 | 4,584 |
| 512 | 16 | 32 | 4,256 | 328 | 0 | 4,584 |
| 4,096 | 0 | 32 | 4,128 | 456 | 0 | 4,584 |
| 4,096 | 8 | 32 | 4,136 | 448 | 0 | 4,584 |
| 4,096 | 16 | 32 | 4,144 | 440 | 0 | 4,584 |
| 4,096 | 64 | 32 | 4,192 | 392 | 0 | 4,584 |
| 4,096 | 72 | 32 | 4,200 | 384 | 0 | 4,584 |

In one embodiment, the total size of each sector is about 4,584 B. The total size of each sector is the sum of the write size, the host metadata size, the internal header size, the parity size, and the padding size. For example, the write size of data to the NVM may be in a size of about 4 K or about 4,096 B. In other embodiments, the LBA size may be in a size of about 512 B, about 8,192, and so forth. Each LBA may include host metadata. The host metadata maybe be any size, such as about 0 B, about 16 B, about 64 B, about 72 B, and so forth. Furthermore, when writing to the NVM, an internal header is attached to the data, which may aid in locating the relevant data. For an LBA size of 512 B and a host metadata size of 8 B, the logical block total size may be about 4,192 B.

When programming to the NVM, the controller may include an ECC engine to encode and decode ECC and error detecting code (EDC) to the logical block and/or an exclusive or (XOR) engine to generate parity data for the data written to the logical block. The parity data or the ECC data may have a size of about 328 to 456 B, and in other embodiments the parity size may be determined by taking the difference of the sector total size and the logical block total size. In order to close a sector, padding is not needed in disclosed embodiments.

In prior approaches, about 328 B of parity data and about 64 B of padding are added to the logical block to obtain a total sector size of about 4,584 B. However, in disclosed embodiments padding is replaced by additional parity bits. Each LDPC matrix of the LDPC encoder/decoder may be optimized, so that writes to each namespace of the NVM fulfill the total sector size, utilizing the parity bits available, while minimizing the size of padding added; in embodiments there are no padding bits added.

In the embodiments described in FIG. 5, the write flow and the read flow may be initiated by the host, such that the host issues a read or a write command to the storage device. The controller receives the read or the write command and either operates along the write flow or the read path. However, the controller may have internal read operations not triggered by the host, such as background operations and reading of the FTL tables from the flash or the NAND.

When writing to the NAND, the controller receives a new LBA and the target namespace ID of the write command from the host. The namespace ID corresponds to a namespace, such as a first NSID A corresponds to a first namespace A. The write path of the LBAs to the NAND or the NVM further includes selecting the LDPC matrix according to namespace ID at block 502. At block 504, the LBA is encoded using the selected matrix to add the optimized ECC or parity data such that no additional padding is required. After encoding the LBA, the LBA and the additional data, such as the ECC or parity data, are programmed to the NAND or the NVM. The data programmed to the NAND is in the output size, which may be represented as the total sector size.

The ECC or parity data size of the LDPC matrix selected may be dependent on several factors, such as the quality of the blocks or the dies. The quality of the blocks or the dies may be qualified as the health portion, where higher quality blocks or dies include higher health portions. The controller may assign the LBA to one or more high health portions of the NVM based on the parity size. For example, a higher health portion of the NVM may require less ECC or parity data, whereas a low health portion of the NVM may require more ECC or parity data.

The LBAs may also be assigned to a namespace dependent on the programming trim. The programming trim may refer to the time for data to program to the NVM and the programming accuracy of the data. Namespaces with different sector sizes will be assigned different programming trims. For example, namespaces with a higher sector size (i.e., a reduced ECC or parity data) will be assigned with longer programming trim times to reduce the number of errors to compensate for the reduced ECC or parity data.

Furthermore, the LBAs may be assigned either SLC memory, MLC memory, TLC memory, QLC memory, and so forth, depending on the type of memory cells included in the data storage device. For example, LBA write sizes that require larger amounts of ECC or parity data may be written to larger memory cells, such as TLC or QLC, whereas LBA write sizes that require fewer amounts of ECC or parity data may be written to smaller memory cells, such as SLC or MLC.

In another embodiment, each NAND die includes a fixed number of redundant columns. After production, the dies are screened, and the defective columns are replaced with the redundant columns in order to ensure that each die includes the same amount of acceptable usable capacity. The LBAs may be assigned to certain dies depending on the amount of acceptable usable capacity of the relevant dies. For example, LBAs including less ECC or parity data may be assigned to dies that include more acceptable usable capacity, whereas LBAs including more ECC or parity data may be assigned to dies that include less acceptable usable capacity.

When the controller receives a read command from the host, the controller, accesses the relevant data from the NAND and transfers it to the controller to be decoded. The read command includes the LBA and the namespace ID to the controller for the relevant data. At block 510, the controller selects the relevant LDPC matrix according to the received namespace ID associated with the read command for the relevant data. At block 512, the data that includes user data, header data, and parity or ECC data is decoded. After decoding, the user data and the header data is transferred to the host to complete the read command.

During an internal read operation, such as the reading of the FTL tables from the NAND, the LDPC encoder/decoder may detect the LDPC matrix sector size based on the first LBA in the command at block 506. The LDPC encoder/decoder may compare the size of the LBA with each of the plurality of LDPC matrices to determine which LDPC matrix to utilize to decode the relevant LBA. At block 508, the LBA and the related data, such as the ECC or parity data, are decoded utilizing the selected LDPC matrix. After decoding, the decoded LBA (i.e., the relevant user data and header data) may be re-encoded and programmed to the originating location of the LBA or a different location in the NAND.

Figure 6:
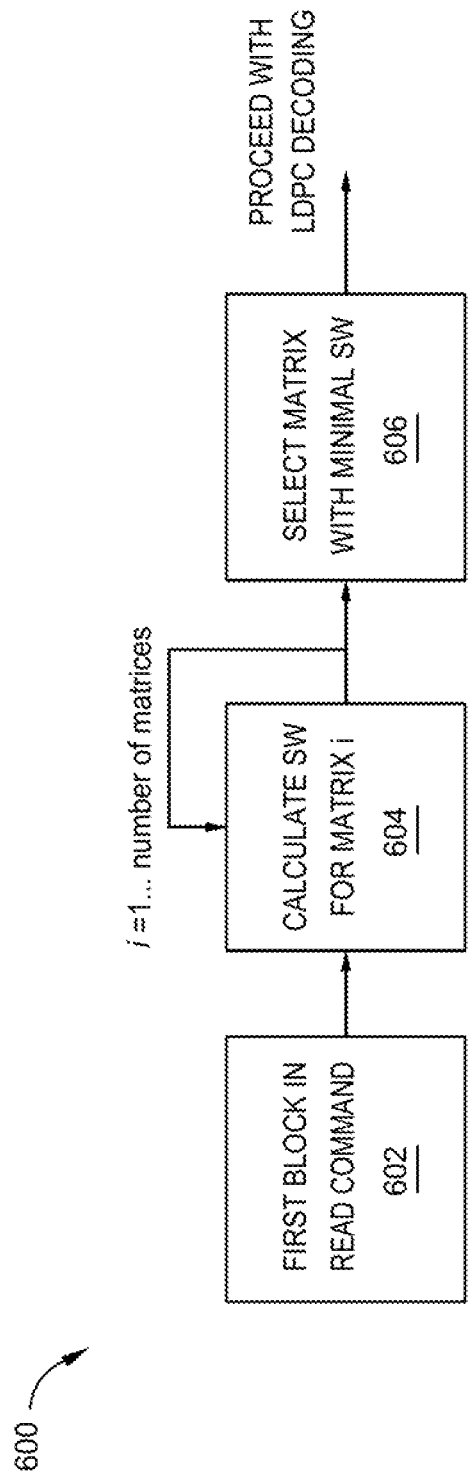
FIG. 6 depicts a flow diagram of automatic LDPC matrix detection in a decoder, according to disclosed embodiments.

FIG. 6 is a flow diagram of automatic LDPC matrix detection in a decoder, according to disclosed embodiments. At block 602, the first block of the data of the relevant sector of the read command is selected. The first block may be the first size of about 512 B of about 4,584 B sector size. At block 604, the LDPC encoder/decoder calculates the syndrome weight (SW) of the first block of data for each matrix of the LDPC encoder/decoder. The syndrome weight may be the bit error rate of the selected block of data. After iterating the calculation to determine the SW for the first block of data of the relevant sector of the read command, the LDPC matrix with the minimal SW is selected at block 606. The LDPC encoder/decoder decodes the relevant sector of the read command by utilizing the selected LDPC matrix at block 606. In one embodiment, the LDPC encoder/decoder may retrieve the data from a die of the one or more memory devices that includes a high health rating or a low health rating. In another embodiment, the LDPC encoder/decoder may retrieve the data from a die of the SLC memory, the MLC memory, the TLC memory, the QLC memory, or so-forth. In yet another embodiment, the LDPC encoder/decoder may retrieve the data from a die that includes at least one good or acceptable redundant column.

In one embodiment, a data storage device is disclosed, including one or more memory devices, and a controller comprising a processor configured to perform a method for improving the performance of a storage device. In embodiments, the method includes receiving a logical block address (LBA) size of an LBA, from a host, receiving a host metadata size from the host, and determining a parity size of an error correction code (ECC), based on the LBA size and the host metadata size.

The data storage device further includes a low density parity code (LDPC). The LDPC includes a plurality of ECC matrices. The method further includes determining a first ECC matrix of the plurality of ECC matrices to generate the ECC of the parity size. Determining the first ECC matrix is based on the LBA size and the host metadata size. The LBA size includes a plurality of LBA sizes, and the host metadata size includes a plurality of host metadata sizes. The one or more memory devices includes a die having a high health portion. The method further includes determining one or more high health portions on the die and assigning the LBA to the determined one or more high health portions based on the parity size. The method further includes assigning a programming trim time to the LBA based on the parity size. The one or more memory devices includes at least one of a single layer cell (SLC), a multi-layer cell (MLC), a tri-layer cell (TLC), and a quad-layer cell (QLC). The method further includes assigning the LBA to one of the SLC, the MLC, the TLC, and the QLC based on the parity size. The one or more memory device includes a good redundant column. The method further includes assigning the LBA to the one or more memory devices with the good redundant column based on the parity size.

In another embodiment, a controller for a data storage device is disclosed, including an I/O to one or more memory devices, and a processor configured to execute a method for improving the performance of a data storage device composed of the controller. In embodiments, the method comprises receiving a request from a host for data at an LBA, and selecting a low density parity check (LDPC) matrix from a plurality of ECC matrices, for decoding the data.

The method that includes selecting the LDPC matrix further includes detecting the sector size of the data at the LBA. The method that includes detecting the sector size includes calculating a syndrome weight for the data. The method further includes calculating a plurality of syndrome weights for the data based on each respective one of the plurality of ECC matrices. The method further includes choosing an ECC matrix of the plurality of ECC matrices that results in the minimal syndrome weight. The method further includes retrieving the data from a die of the one or more memory devices having one of a high health rating and a low health rating, based on the LDPC matrix. The method further includes retrieving the data from a die of the one or more memory devices having one of an SLC, an MLC, a TLC, and a QLC, based on the LDPC matrix. The method further includes retrieving the data from a die of the one or more memory devices having at least one good redundant column, based on the LDPC matrix.

In another embodiment, a data storage system is disclosed, including one or more memory means, and one or more controller means configured to execute a method for improving the performance of a data storage system. In embodiments, the method includes receiving data to the one or more memory means from a host, and selecting an LDPC matrix to encode the data, based on a sector size of the received data, reading data from the one or more memory means, and decoding the data using an LDPC matrix selected from one or more LDPC matrices, based on the sector size of the data.

The sector size is based on an LBA size, a host metadata size, and an internal header size. The method further includes writing the received data based on the LDPC matrix to one of a high quality portion of the one or more memory means, one of an SLC, an MLC, a TLC, and a QLC, and a redundant column of the one or more memory means. The LDPC matrix is selected from the one or more LDPC matrices based on the sector size of the data includes calculating a syndrome weight of the data.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   one or more memory devices; and
   a controller comprising a processor configured to perform a method for improving performance of the storage device, the method comprising:
   receiving a logical block address (LBA) size of an LBA, from a host;
   receiving a host metadata size from the host; and
   determining a parity size of an error correction code (ECC), based on the difference between the LBA size and the host metadata size, wherein the difference is used for parity data instead of padding.

2. The data storage device of claim 1, further comprising a low density parity code (LDPC), the LDPC comprising a plurality of ECC matrices, wherein the method further comprises determining a first ECC matrix of the plurality of ECC matrices to generate the ECC of the parity size.

3. The data storage device of claim 2, wherein the determining the first ECC matrix is based on the LBA size and the host metadata size.

4. The data storage device of claim 2, wherein the LBA size comprises a plurality of LBA sizes, and the host metadata size comprises a plurality of host metadata sizes.

5. The data storage device of claim 2, wherein the one or more memory devices comprises a die having high health portions, the method further comprising determining one or more high health portions on the die, and assigning the LBA to the determined one or more high health portions based on the parity size.

6. The data storage device of claim 2, wherein the one or more memory devices comprises at least one of a single layer cell (SLC), and at least one of a multi-layer cell (MLC), a tri-layer cell (TLC), or a quad-layer cell (QLC), wherein the method further comprises assigning the LBA to the one of the SLC, the MLC, the TLC, and the QLC based on the parity size.

7. The data storage device of claim 2, wherein the one or more memory device comprises a good redundant column, wherein the method further comprises assigning the LBA to the one or more memory devices with the good redundant column based on the parity size.

8. A data storage device, comprising:
   one or more memory devices;
   a controller comprising a processor configured to perform a method for improving performance of the storage device, the method comprising:
   receiving a logical block address (LBA) size of an LBA, from a host;
   receiving a host metadata size from the host; and
   determining a parity size of an error correction code (ECC), based on the LBA size and the host metadata size; and
   a low density parity code (LDPC) comprising a plurality of ECC matrices, the method further comprising:
   determining a first ECC matrix of the plurality of ECC matrices to generate the ECC of the parity size; and
   assigning a programming trim time to the LBA based on the parity size.

9. A controller for a data storage device, comprising:
   an I/O to one or more memory devices; and
   a processor configured to execute a method for improving performance of a data storage device composed of the processor, the method comprising:
   receiving a request from a host for data at a Logical Block Address (LBA); and
   selecting a low density parity check (LDPC) matrix from a plurality of ECC matrices that utilizes remaining sector size for parity data instead of padding for decoding the data.

10. The controller of claim 9, wherein the selecting the LDPC matrix further comprises detecting a sector size of the data at the LBA.

11. The controller of claim 10, wherein the processor is further configured to calculate a syndrome weight for the data.

12. The controller of claim 9, the method further comprising retrieving the data from a die of the one or more memory devices having one of a high health rating and a low health rating, based on the LDPC matrix.

13. The controller of claim 9, the method further comprising retrieving the data from a die of the one or more memory devices having one of an SLC, an MLC, a TLC, or a QLC, based on the LDPC matrix.

14. The controller of claim 9, the method further comprising retrieving the data from a die of the one or more memory devices having at least one good redundant column, based on the LDPC matrix.

15. A controller for a data storage device, comprising:
an I/O to one or more memory devices; and
a processor configured to execute a method for improving performance of a data storage device composed of the processor, the method comprising:
receiving a request from a host for data at a Logical Block Address (LBA);
selecting a low density parity check (LDPC) matrix from a plurality of ECC matrices for decoding the data, wherein the selecting the LDPC matrix further comprises detecting a sector size of the data at the LBA;
calculating a syndrome weight for the data; and
calculating a plurality of syndrome weights for the data based on each respective one of the plurality of ECC matrices.

16. The controller of claim 15, the method further comprising choosing an ECC matrix of the plurality of ECC matrices that results in a minimal syndrome weight.

17. A data storage system, comprising:
one or more memory means; and
one or more controller means configured to execute a method for improving performance of the data storage system, the method comprising:
receiving data to the one or more memory means from a host and selecting a Low Density Parity Check (LDPC) matrix to encode the data based on a sector size of the received data, wherein a difference between a size of the received data and metadata and the sector size of the received data is used for parity data instead of padding;
reading the data from the one or more memory means; and
decoding the data using by selecting the LDPC matrix from the one or more LDPC matrices based on the sector size of the data.

18. The data storage system of claim 17, the method further comprising wherein the sector size is based on an LBA size, a host metadata size, and an internal header size.

19. The data storage system of claim 17, the method further comprising writing the received data based on the LDPC matrix to one of:
a high quality portion of the one or more memory means;
one of an SLC, an MLC, a TLC, and a QLC; and
a redundant column of the one or more memory means.

20. The data storage system of claim 17, the sector size is stored in a LDPC encoder/decoder.

* * * * *